United States Patent
Takahashi

(10) Patent No.: US 8,254,496 B2
(45) Date of Patent: Aug. 28, 2012

(54) POWER AMPLIFIER AND RADIO WAVE TRANSMITTER HAVING THE SAME

(75) Inventor: Kiyohiko Takahashi, Tokyo (JP)

(73) Assignee: NEC Corporation, Tokyo (JP)

( * ) Notice: Subject to any disclaimer, the term of this patent is extended or adjusted under 35 U.S.C. 154(b) by 158 days.

(21) Appl. No.: 12/740,871

(22) PCT Filed: Aug. 22, 2008

(86) PCT No.: PCT/JP2008/064975
§ 371 (c)(1),
(2), (4) Date: Apr. 30, 2010

(87) PCT Pub. No.: WO2009/060652
PCT Pub. Date: May 14, 2009

(65) Prior Publication Data
US 2010/0266066 A1 Oct. 21, 2010

(30) Foreign Application Priority Data
Nov. 5, 2007 (JP) .................................. 2007-287282

(51) Int. Cl.
H04K 1/02 (2006.01)
H04L 25/03 (2006.01)
H04L 25/49 (2006.01)
(52) U.S. Cl. ........... 375/297; 330/84; 330/127; 330/200
(58) Field of Classification Search .................... 330/84, 330/127, 200; 375/295, 297
See application file for complete search history.

(56) References Cited

U.S. PATENT DOCUMENTS

| 6,681,101 | B1 * | 1/2004 | Eidson et al. ............... 455/127.1 |
| 7,502,422 | B2 * | 3/2009 | Dennis et al. .................. 375/295 |
| 2003/0132800 | A1 * | 7/2003 | Kenington ................ 330/124 R |
| 2005/0030104 | A1 | 2/2005 | Chen et al. |
| 2005/0280471 | A1 | 12/2005 | Matsushita et al. |

FOREIGN PATENT DOCUMENTS

| JP | 09-036675 | 2/1997 |
| JP | 2000-349574 | 12/2000 |
| JP | 2002-190995 | 7/2002 |

(Continued)

OTHER PUBLICATIONS

International Search Report, PCT/JP2008/064975, Nov. 18, 2008.

(Continued)

*Primary Examiner* — Curtis Odom
(74) *Attorney, Agent, or Firm* — Young & Thompson

(57) ABSTRACT

A power amplifier (10) comprises: an A/D converter (11) for converting, to a time discrete signal, an envelope signal included in a high-frequency modulated signal and including only an amplitude modulated component of the high-frequency modulated signal; a switching amplifier (12) for amplifying the output signal of the A/D converter (11); a low-pass filter (13) for removing high frequency noise from the output signal of the switching amplifier (12); a plurality of high-frequency power amplifiers (15-1 to 15-n) for receiving the output signal of the low-pass filter (13) as a power supply and for amplifying a carrier signal included in the high-frequency modulated signal; and a power controller (14) for adjusting the average power of the output signal of the power amplifier (10) by controlling the total gains of the plurality of high-frequency power amplifiers (15-1 to 15-n).

19 Claims, 7 Drawing Sheets

FOREIGN PATENT DOCUMENTS

| | | |
|---|---|---|
| JP | 2003-304127 | 10/2003 |
| JP | 2005-045817 | 2/2005 |
| JP | 2005-086673 | 3/2005 |
| JP | 2005-295533 | 10/2005 |
| JP | 2006-013566 | 1/2006 |
| JP | 2006-135422 | 5/2006 |
| JP | 2006-2006-295900 | 10/2006 |
| JP | 2006-325115 | 11/2006 |
| WO | WO2007/004518 | 6/2006 |

OTHER PUBLICATIONS

Bandpass Sigma Delta Modulators, authored by Jurgen van Engelen and Ruby van de Plassche, Kluwer Academic Publishers, p. 47, Figure 4.7.

Systematic Design of Sigma-Delta Analog-to-Digital Converters, authored by Ovidiu Bajechi and Johan H. Huijsing, Kluwer Academic Publishers, p. 16, Figure 2.6.

* cited by examiner

POWER AMPLIFIER AND RADIO WAVE TRANSMITTER HAVING THE SAME

TECHNICAL FIELD

The present invention relates to a power amplifier and a radio wave transmitter having the same, and particularly, to a power amplifier and a radio wave transmitter having the same, which do not entail a change in SNR (Signal to Noise Ratio) of an output signal even if an average power of the output signal is changed.

BACKGROUND ART

In recent years, radio communications, such as those based on portable telephones and the like, employ a modulation scheme which demonstrates a high frequency utilization efficiency and a large peak-to-average power ratio (PAPR).

In the field of radio communications, for amplifying a modulated signal including an amplitude modulated component using an AB-class amplifier which has been conventionally employed, sufficient back-off must be taken in order to maintain the linearity of an output signal. Generally, this back-off is required to be at least in the order of PAPR.

On the other hand, the AB-class amplifier exhibits a power efficiency which reaches a maximum at output saturation, and becomes lower as the back-off increases. As such, a modulated signal having larger PAPR encounters larger difficulties in increasing the power efficiency of a power amplifier.

A polar modulation type power amplifier is representative of a power amplifier for highly efficiently amplifying such a modulated signal which has large PAPR. The polar modulation type power amplifier amplifies a high-frequency modulated signal for radio communications, which is generated on the basis of polar coordinate components of amplitude and phase. Also, polar modulation type power amplifiers include one which is particularly referred to as an EER (Envelope Elimination and Restoration) type power amplifier. The EER type power amplifier is configured to substitute for an AB-class amplifier.

FIG. 1 shows the configuration of an RF (Radio Frequency) transmitter as an exemplary radio wave transmitter which comprises an associated polar modulation type power amplifier.

The RF transmitter shown in FIG. 1 comprises digital baseband unit 201, analog baseband unit 205, and EER-type power amplifier 214.

Digital baseband unit 201 generates three types of signals, i.e., a power control signal, an I-signal, and a Q-signal which are delivered to analog baseband unit 205 through power control signal output terminal 202, I-signal output terminal 203, and Q-signal output terminal 204, respectively.

In analog baseband unit 205, the I-signal delivered from I-signal output terminal 203 is applied to and converted to an analog signal by DA (Digital-to-Analog) converter 206. Likewise, the Q-signal delivered from Q-signal output terminal 204 is applied to and converted to an analog signal by DA converter 210.

The I-signal and Q-signal converted to analog signals are multiplied by signals supplied from local oscillator 208 through phase shifter 209, by mixer 207 and mixer 211, respectively. In this event, the signal supplied from phase shifter 209 to mixer 211 has a phase delayed by 90° from the signal supplied from phase shifter 209 to mixer 207.

The output signal of mixer 207 and the output signal of mixer 211 are added by adder 212 to generate a high-frequency modulated signal. The high-frequency modulated signal delivered from adder 212 is amplified by variable gain amplifier 213, and then delivered to EER-type power amplifier 214. In this event, the gain of variable gain amplifier 213 is varied in accordance with a power control signal delivered from power control signal output terminal 202.

In EER-type power amplifier 214, the high-frequency modulated signal delivered from variable gain amplifier 213 is applied to envelope detector 215 and limiter 219. Envelope detector 215 extracts an envelope signal from the high frequency modulated signal input thereto. The envelope signal extracted by envelope detector 215 is linearly amplified in an amplification path which is provided with AD (Analog-to-Digital) converter 216, switching amplifier 217, and low-pass filter 218. Limiter 219 extracts a phase modulated signal, which presents a substantially uniform envelope, from the high-frequency modulated signal input thereto, and delivers the phase modulated signal to high-frequency power amplifier 220. High-frequency power amplifier 220 is supplied with the envelope signal delivered from low-pass filter 218 as a power supply, and amplifies the phase modulated signal delivered from limiter 219 by multiplying the same by the power supply. The thus amplitude modulated output signal is delivered from signal output terminal 221.

EER-type power amplifier 214 can increase the power efficiency because it can employ switching amplifier 217 which is highly efficient in the amplification of the envelope signal, and because the multiplication processing can be highly efficiently performed in high-frequency power amplifier 220.

A signal band handled by envelope detector 215 is similar to a signal band for the output signal of variable gain amplifier 213, and typically ranges approximately from several hundreds of kHz to several tens of MHz. Accordingly, the envelope signal can be amplified by a D-class amplifier or the like, which comprises AD converter 216 for generating a bit stream signal such as PDM (Pulse Density Modulation) or the like, switching amplifier 217, and low-pass filter 218, ideally without causing a power loss.

Meanwhile, high-frequency power amplifier 220 is operating in a saturation region with the output signal of low-pass filter 218 which is being supplied as a power supply. Generally, high-frequency power amplifier 220 is characterized by operating at the highest power efficiency when the output is saturated.

With the foregoing configuration, the power efficiency of EER-type power amplifier 214 is given by the product of the power efficiency of switching amplifier 217 with the power efficiency of high-frequency power amplifier 220, and theoretically, high-frequency power amplifier 220 provides the highest efficiency at all times.

Alternatively, polar modulation type power amplifiers have been proposed for performing amplitude modulation in different ways, other than EER-type power amplifier 214 shown in FIG. 1. As an example, FIG. 2 shows the configuration of a polar modulation type power amplifier described in Patent Document 1.

The polar modulation type power amplifier shown in FIG. 2 performs amplitude modulation by switching the number of saturated amplification units 304 which are set to an operable state (is turned on) among a plurality of saturated amplification units 304.

First, local oscillator 303 applies a phase modulated signal to each of the plurality of saturated amplification units 304. On the other hand, an amplitude modulated signal is applied from modulated signal input terminal 301, and is converted to a control signal for saturated amplification units 304 by amplitude controller 306. The control signal from amplitude controller 306 determines whether each of a plurality of saturated amplification units 304, arranged in parallel, should be set into an operable state or a sleep state (off-state). The phase modulated signals delivered from saturated amplification units 304 in the operable state are combined by output combiner circuit 305, and delivered from output terminal 302.

Here, the modulated signal delivered from output terminal 302 has an amplitude which is a sum total of the amplitudes of the phase modulated signals delivered from saturated amplification units 304. Accordingly, the amplitude modulation can be performed by varying the number of saturated amplification units 304 which are in the operable state.

However, since the polar modulation type power amplifiers shown in FIGS. 1 and 2 convert an envelope signal to a time discrete signal which is quantified through AD conversion, quantization noise occurs. In the polar modulation type amplifier, the quantization noise has a magnitude which is substantially uniform irrespective of output power, so that the output signal deteriorates in SNR particularly when the output power decreases more from a maximum power.

In the polar modulation type power amplifiers shown in FIGS. 1 and 2, the output signal varies in SNR depending on the output power for causes which are attributable to basic characteristics of the AD converter for use in amplification of the envelope signal. FIG. 3 shows the relationship between an input power and SNR of an output signal in an ideal AD converter.

As shown in FIG. 3, in an ideal AD converter, SNR (dB) of an output signal can be represented by a first-order function of input power (dBm) within the range of output saturation. This fact is shown, for example, in Non-Patent Document 1, Non-Patent Document 2, and the like.

For the reason set forth above, when an envelope signal applied to an AD converter as an input signal has a lower average power, an envelope signal delivered from the AD converter will deteriorate in SNR.

For example, in W-CDMA based communications, the radio wave strength is adjusted in accordance with the distance between a base station and a portable terminal. Accordingly, a W-CDMA based radio wave transmitter requires a circuit for controlling the output power of a polar modulation type power amplifier.

In the radio wave transmitter shown in FIG. 1, the output power of EER-type power amplifier 214 is adjusted by variable gain amplifier 213 which is positioned antecedent to AD converter 216. Consequently, since AD converter 216 is applied with an envelope signal with a varying average power, SNR will vary in the envelope signal amplification path.

Likewise, SNR also varies in the polar modulation type power amplifier shown in FIG. 2. For controlling the output power with the polar modulation type power amplifier shown in FIG. 2, it is necessary to vary the number of saturated amplification units 304 which are controlled to be in operable state by amplitude controller 306. Amplitude controller 306 plays the same role as AD converter 206 shown in FIG. 1, and the number of bits representative of the magnitude of an envelope signal is represented by the number of saturated amplification units 304 which are in operable state. Accordingly, the relationship between the input power of the envelope signal and the SNR in the polar modulation type power amplifier shown in FIG. 2 is the same as that shown in FIG. 3, so that the envelope signal varies in SNR due to variations in average power of the output signal.

As described above, in a power amplifier used in a radio wave transmitter, a change in the average power of an output signal causes the SNR to vary on an envelope signal amplification path, resulting in variations in SNR of the output signal. Particularly, the output signal tends to deteriorate in SNR when a power amplifier generates an output signal with reduced average power.

From the foregoing, the power amplifier has a challenge in maintaining SNR of the output signal substantially constant irrespective of the average power of the output signal.

Patent Document 1: JP2005-86673A (FIG. 4).

Non-Patent Document 1: "Systematic Design of Sigma-Delta Analog-to-Digital Converters," authored by Ovidiu Bajdechi and Johan H. Huijsing, Kluwer Academic Publishers, p. 16, FIG. 2.6.

Non-Patent Document 2: "Bandpass Sigma Delta Modulators," authored by Jurgen van Engelen and Rudy van de Plassche, Kluwer Academic Publishers, p. 47, FIG. 4.7.

DISCLOSURE OF THE INVENTION

It is therefore an object of the present invention to provide a power amplifier and a radio wave transmitter having the same, which solve the problems described above.

A power amplifier of the present invention is provided for amplifying a high-frequency modulated signal. The power amplifier is characterized by comprising:

an AD converter for converting an envelope signal included in the high-frequency modulated signal, to a time discrete signal, where the envelope signal includes only an amplitude modulated component of the high-frequency modulated signal;

a switching amplifier for amplifying an output signal of the AD converter;

a low-pass filter for removing high-frequency noise from an output signal of the switching amplifier;

a plurality of high-frequency power amplifiers supplied with an output signal of the low-pass filter as a power supply for amplifying a carrier signal included in the high-frequency modulated signal; and a power controller for controlling a total gain of the plurality of high-frequency power amplifiers, thereby adjusting an average power of an output signal of the power amplifier.

A first radio wave transmitter of the present invention is characterized by further comprising:

the power amplifier;

a digital baseband circuit for generating a power control signal, an I-signal, and a Q-signal; and a polar coordinate conversion circuit for generating the envelope signal and the carrier signal based on the I-signal and the Q-signal delivered from the digital baseband circuit, wherein the AD converter receives the envelope signal delivered from the polar coordinate conversion circuit, the plurality of high-frequency power amplifiers receive the carrier signal delivered from the polar coordinate conversion circuit, and the power controller receives the power control signal delivered from the digital baseband circuit, and conducts on/off control for the plurality of high-frequency power amplifiers based on the power control signal to adjust the average power of the output signal of the power amplifier.

A second radio wave transmitter of the present invention is characterized by further comprising:

the power amplifier;

a digital baseband circuit for generating a power control signal, an I-signal, and a Q-signal; and a polar coordinate conversion circuit for generating the high-frequency modulated signal based on the I-signal and the Q-signal delivered from the digital baseband circuit, and further generating the envelope signal and the carrier signal based on the high-frequency modulated signal, wherein the AD converter receives the envelope signal delivered from the polar coordinate conversion circuit, a high-frequency power amplifier at a first stage among the plurality of high-frequency power amplifiers receives the carrier signal delivered from the polar coordinate conversion circuit, and the power controller receives the power control signal delivered from the digital baseband circuit, and conducts switching control for the high frequency switches based on the power control signal to adjust the average power of the output signal of the power amplifier.

In the power amplifier of the present invention, the envelope signal is amplified by the AD converter, switching amplifier, and low pass filter, while the average power of the output signals of the power amplifiers is adjusted by the power controller, and the plurality of high-frequency power amplifiers.

In particular, in the power amplifier of the present invention, since the amplification of the envelope signal is performed independently of the adjustments to the average power of the output signals, the average power of the output signals is not adjusted antecedent to the AD converter which is located on an envelope signal amplification path.

Accordingly, the average power of the envelope signal, applied to the AD converter as an input signal, does not vary depending on the average power of the output signals, and remains substantially constant.

As a result, since the output signal of the AD converter presents a substantially constant SNR at all times, the power amplifier can generate an output signal with a substantially constant SNR at all times.

For the reasons set forth above, the power amplifier can advantageously maintain the SNR of its output signal substantially constant at all times independently of the average power of the output signal.

BEST MODE FOR CARRYING OUT THE INVENTION

In the following, the best mode for carrying out the present invention will be described with reference to the drawings.

Notably, while the following description will be given on the assumption that a power amplifier according to the present invention is a polar modulation type power amplifier, the present invention is not so limited but can be applied to an envelope tracking type power amplifier which performs an operation referred to as "envelope tracking." In this respect, a description will be given later.

First Embodiment

Figure 4:
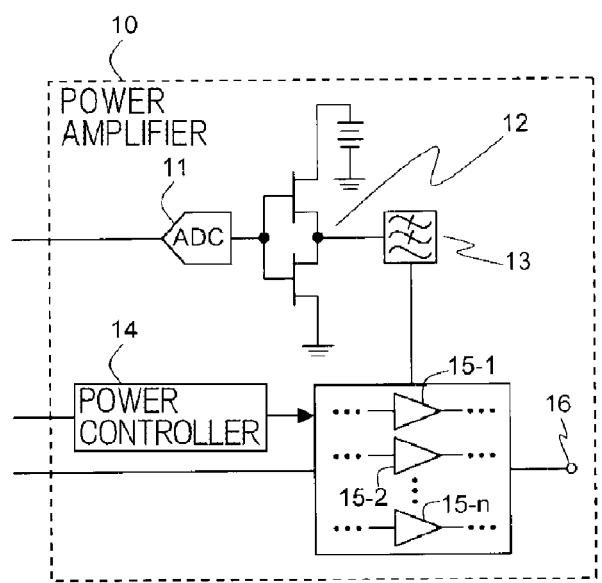
FIG. 4
A diagram showing the configuration of a power amplifier according to a first embodiment of the present invention.

FIG. 4 shows the configuration of power amplifier 10 according to a first embodiment of the present invention.

As shown in FIG. 4, power amplifier 10 of this embodiment comprises AD converter 11, switching amplifier 12, low-pass filter 13, power controller 14, a plurality of high-frequency power amplifiers 15-1~15-$n$ ($n$ is an integer given by $n \geq 2$), and modulated signal output terminal 16.

AD converter 11 is applied with an envelope signal which includes only an amplitude modulated component of a high-frequency modulated signal for use in radio communications for conversion of the same to a time discrete signal.

Switching amplifier 12 amplifies the output signal of AD converter 11.

Low-pass filter 13 removes high-frequency noise from the output signal of switching amplifier 12.

Each of the plurality of high-frequency power amplifiers 15-1~15-$n$ are supplied with the output signal of low-pass filter 13 as a power supply, and used for amplifying a carrier signal included in the high-frequency modulated signal. While the plurality of high-frequency power amplifiers 15-1~15-$n$ are arranged in parallel in FIG. 4, they can be alternatively arranged in series.

Power controller 14 controls a total gain of the plurality of high-frequency power amplifiers 15-1~15-$n$ to adjust the average power of the output signal of power amplifier 10. The output signal (modulated signal) whose average power has been adjusted by power controller 14, is delivered from modulated signal output terminal 16.

In power amplifier 10 of this embodiment, an envelope signal is amplified by AD converter 11, switching amplifier 12, and low-pass filter 13. Specifically, AD converter 11 converts an envelope signal included in a high-frequency modulated signal to a time discrete signal, switching amplifier 12 amplifies the output signal of AD converter 11, and low-pass filter 13 removes high-frequency noise from the output signal of switching amplifier 12. The output signal of low-pass filter 13 is supplied to the plurality of high-frequency power amplifiers 15-1~15-$n$ as a power supply.

On the other hand, the average power of the output signal of power amplifier 10 is adjusted by power controller 14 and a plurality of high-frequency power amplifiers 15-1~15-n. Specifically, the carrier signal included in the high-frequency modulated signal is amplified using the plurality of high-frequency power amplifiers 15-1~15-n which are supplied with the output signal of low-pass filter 13 as a power supply. In this event, power controller 14 controls the total gain of the plurality of high-frequency power amplifiers 15-1~15-n to adjust the average power of the output signal of power amplifier 10.

Stated another way, power amplifier 10 of this embodiment amplifies the envelope signal and adjusts the average power of the output signal, independently of each other.

As such, even when the average power of the output signal of power amplifier 10 is adjusted, for example, for adjusting the radio wave strength in W-CDMA based communication, the average power of the output signal is not adjusted antecedent to AD converter 11 which is included in the envelope signal amplification path.

Consequently, the average power of the envelope signal applied to AD converter 11 as an input signal does not vary depending on the average power of the output signal, and is substantially constant at all times.

As a result, since the output signal of AD converter 11 presents a substantially constant SNR at all times, the SNR of the output signal of AD converter 11 can be maintained substantially constant.

Figure 5:
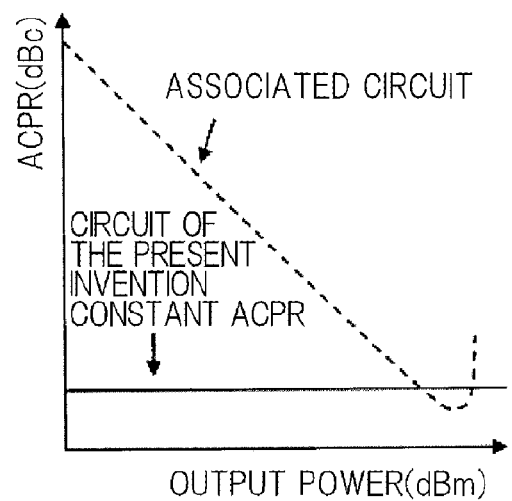
FIG. 5
A diagram for describing the relationship between output power and linearity in the power amplifier according to the first embodiment of the present invention.

FIG. 5 shows the relationship between the average power of the output signal and ACPR (Adjacent Channel Power Ratio) of the output signal in power amplifier 10 of this embodiment.

Figure 1:
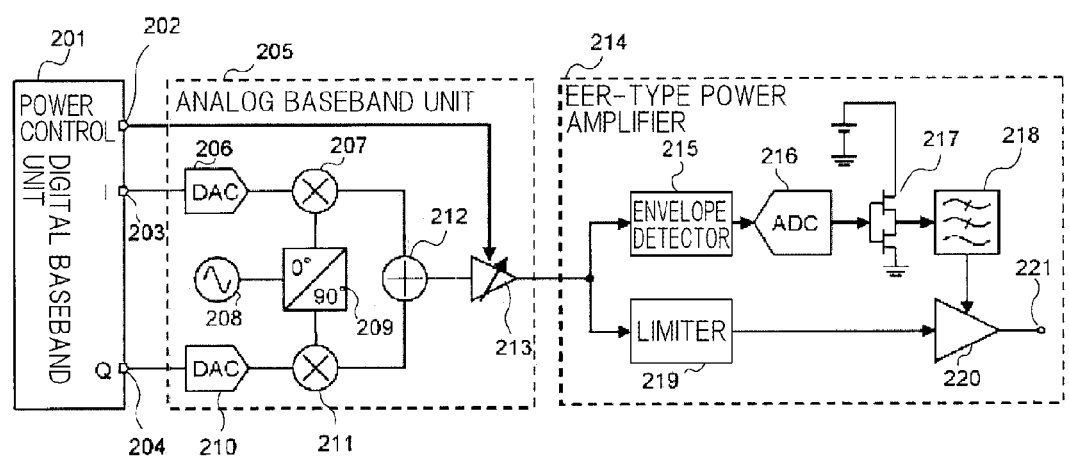
FIG. 1
A diagram showing the configuration of a radio wave transmitter which comprises an associated EER-type power amplifier.
Figure 2:
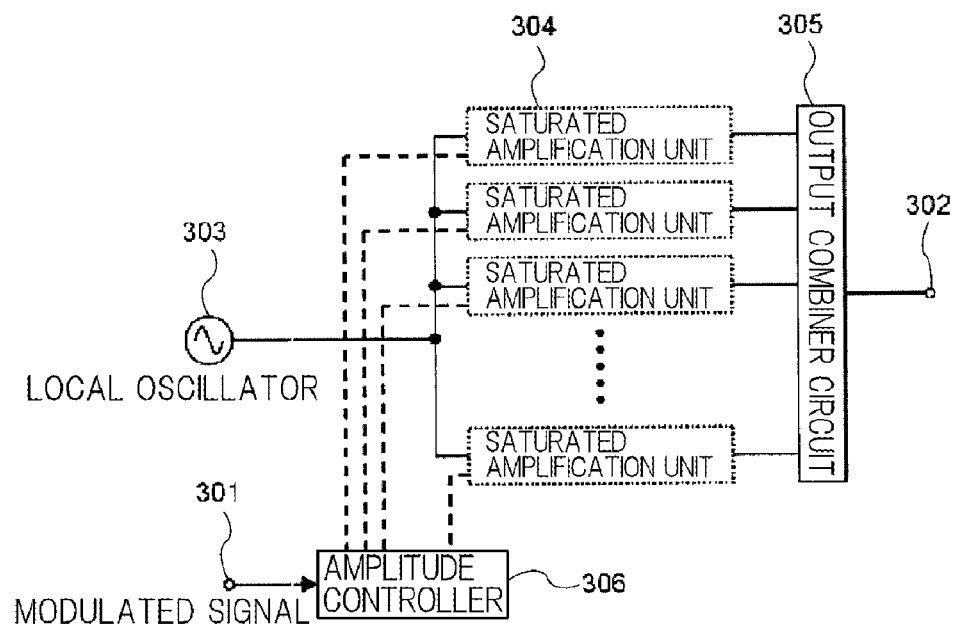
FIG. 2
A diagram showing the configuration of an associated polar modulation type power amplifier.

In the polar modulation type power amplifiers shown in FIGS. 1 and 2, ACPR of the output signal increases as the average power of the output signal is reduced. This is caused by the fact that when an attempt is made to reduce the average power of the output signal, this reduction entails a need for reducing the average power of the input signal to the AD converter, which results in a reduction in SNR of the output signal of the AD converter.

In contrast, in power amplifier 10 of this embodiment, the average power of the output signal is adjusted by power controller 14 and the plurality of high-frequency power amplifiers 15-1~15-n, which are located on a path independent of the envelope signal amplification path which includes AD converter 11, so that AD converter 11 is applied with an input signal which has a substantially constant average power, thus making ACPR of the output signal substantially constant at all times.

Second Embodiment

Figure 6:
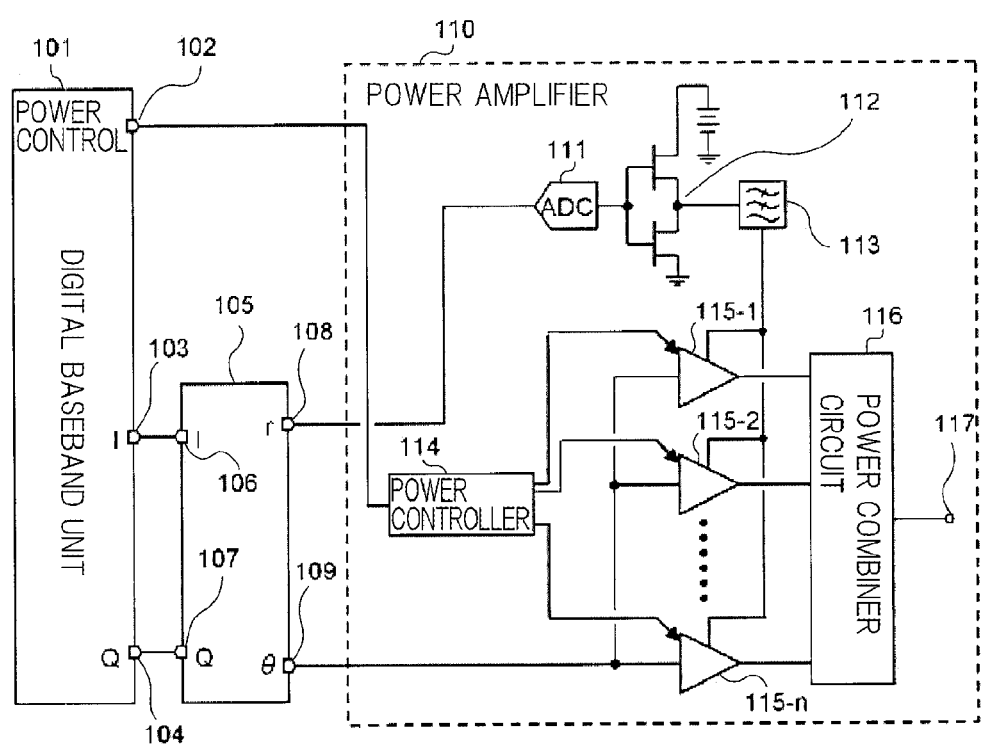
FIG. 6
A diagram showing the configuration of a radio wave transmitter which comprises a power amplifier according to a second embodiment of the present invention.

FIG. 6 shows the configuration of a radio wave transmitter which comprises power amplifier 110 according to a second embodiment of the present invention.

The radio wave transmitter shown in FIG. 6 comprises digital baseband unit 101, polar coordinate conversion circuit 105, and power amplifier 110.

Digital baseband unit 101 in turn comprises power control signal output terminal 102, I-signal output terminal 103, and Q-signal output terminal 104. Polar coordinate conversion circuit 105 in turn comprises I-signal input terminal 106, Q-signal input terminal 107, envelope signal output terminal 108, and phase modulated signal output terminal 109. Power amplifier 110 in turn comprises AD converter 111, switching amplifier 112, low-pass filter 113, power controller 114, high-frequency power amplifiers 115-1~115-n (n is an integer given by n≧2), power combiner circuit 116, and modulated signal output terminal 117.

Digital baseband unit 101 generates a power control signal, an I-signal, and a Q-signal. The power control signal is delivered from power control signal output terminal 102 to power amplifier 110. On the other hand, the I-signal and Q-signal are delivered to polar coordinate conversion circuit 105 from I-signal output terminal 103 and Q-signal output terminal 104, respectively.

Polar coordinate conversion circuit 105 is applied with the I-signal and Q-signal from I-signal input terminal 106 and Q-signal input terminal 107, respectively. Polar coordinate conversion circuit 105 generates a high-frequency modulated signal based on the I/Q signals applied thereto. Further, polar coordinate conversion circuit 105 generates an envelope signal which includes only an amplitude modulated component of the high-frequency modulated signal, and also generates a phase modulated signal as a carrier signal. The phase modulated signal includes only a phase modulated component of the high-frequency modulated signal, is up-converted to a carrier frequency band, and presents a substantially constant envelope. The envelope signal and phase modulated signal are respectively delivered from envelope signal output terminal 108 and phase modulated signal output terminal 109 to power amplifier 110.

In power amplifier 110, the envelope signal delivered from envelope signal output terminal 108 is applied to AD converter 111. The power control signal delivered from power control signal output terminal 102 in turn is applied to power controller 114. Further, the phase modulated signal delivered from phase modulated signal output terminal 109 is applied to high-frequency power amplifiers 115-1~115-n. The envelope signal applied to AD converter 111 has a substantially constant average power at all times. This is because the output power of power amplifier 110 is not controlled antecedent to AD converter 111, but is controlled by way of a path different from the envelope signal amplification path. In contrast, in EER-type power amplifier 214 shown in FIG. 1, since the output power of EER-type power amplifier 214 is controlled by variable gain amplifier 213 antecedent to AD converter 216, the average power of the envelope signal applied to AD converter 216 varies. For a similar reason, the average power of the phase modulated signal applied to high-frequency power amplifiers 115-1~115-n is also substantially constant at all times.

AD converter 111 converts the envelope signal delivered from envelope signal output terminal 108 to a time discrete signal which is delivered to switching amplifier 112.

Switching amplifier 112 highly efficiently amplifies the time discrete signal applied thereto, and delivers the amplified time discrete signal to power supply terminals of high-frequency power amplifiers 115-1~115-n through low-pass filter 113 to remove high-frequency noise.

Power controller 114 individually generates control signals delivered to the plurality of high-frequency power amplifiers 115-1~115-n based on the power control signal delivered from power control signal output terminal 102.

The control signal delivered from power controller 114 determines that each of high-frequency power amplifiers 115-1~115-n is to enter an on-state or an off-state. High-frequency power amplifier 115-1~115-n, when in on-state, amplifies the phase modulated signal delivered from phase modulated signal output terminal 109 by multiplying the same by the envelope signal delivered from low-pass filter 113 for use as a power supply, to generate a modulated signal. On the other hand, high-frequency power amplifier 115-1~115-n, when in the off-state, does not generate a modulated signal, but remains in a sleep state. Output signals of high-frequency power amplifiers 115-1~115-n are combined by power combiner circuit 116, and delivered from modulated signal output terminal 117.

The I/Q signals and the modulated signal generated from the I/Q signals are signals which contain communication data. On the contrary, the power control signal is a signal for varying the average power of the output signal of power amplifier 110 in accordance with the distance between communication devices (for example, between a portable terminal and a base station when the portable terminal is a portable telephone).

Power amplifier 110 of this embodiment adjusts the average power of the output signal in terms of total output power of high-frequency power amplifiers 115-1~115-n which are in the on-state. In this way, AD converter 111 used to amplify an envelope signal is applied at all times with an envelope signal having a substantially constant average power because the average power of the output signal is not adjusted antecedent thereto. Accordingly, the envelope signal is converted to a time discrete signal with a substantially constant SNR by AD converter 111.

Since AD converter 111 is a main noise source in power amplifier 110 of this embodiment, if the output signal of AD converter 111 presents a substantially constant SNR at all times, the modulated signal delivered from modulated signal output terminal 117 also presents a substantially constant SNR.

Notably, in power amplifier 110 of this embodiment, a method of designing/controlling high-frequency power amplifiers 115-1~115-n can be modified in accordance with a desired output power.

For example, when all high-frequency power amplifiers 115-1~115-n are designed such that their saturated output powers are equal to one another, a proportional relationship is developed between the number of high-frequency power amplifiers 115-1~115-n in the on-state and the output power, thus making it easier to control the output power. In this event, power controller 114 converts the power control signal delivered from power control signal output terminal 102 to a value at one of (n+1) steps from zero to n, and controls high-frequency power amplifiers 115-1~115-n such that the converted value at one of (n+1) steps is equal to the number of high-frequency power amplifiers 115-1~115-n which are turned on.

As another example, it is also contemplated to design high-frequency power amplifiers 115-1~115-n such that their saturated output powers are respectively provided in the ratio of, such as 1:2:4: . . . :2(n−1). In doing so, the output power can be controlled in a range of zero to 2(n−1) times as large as the minimum step width of the output power. Here, the minimum step width of the output power is equal to the saturated power of high-frequency power amplifier 115-1. In this event, power controller 114 converts the power control signal delivered from power control signal output terminal 102 to an n-bit signal, and controls high-frequency power amplifiers 115-1~115-n such that high-frequency power amplifier 115-k is brought into the on-state when a k-th bit (1≦k≦n) counted from the least significant bit is "1" (High), and is brought into off-state when the k-th bit is "0" (Low).

Alternatively, in power amplifier 110 of this embodiment, the phase modulated signal delivered from phase modulated signal output terminal 109 may be replaced with a modulated signal which includes a phase modulated component and an amplitude modulated component of a high-frequency modulated signal. In this configuration, power amplifier 110 performs an operation referred to as "envelope tracking," and behaves as an envelope tracking type power amplifier.

Third Embodiment

A power amplifier according to a third embodiment of the present invention is modified such that the average power of the output signal can be adjusted by a method other than the on/off control of high-frequency power amplifiers 115-1~115-n, as performed in the second embodiment.

Figure 7:
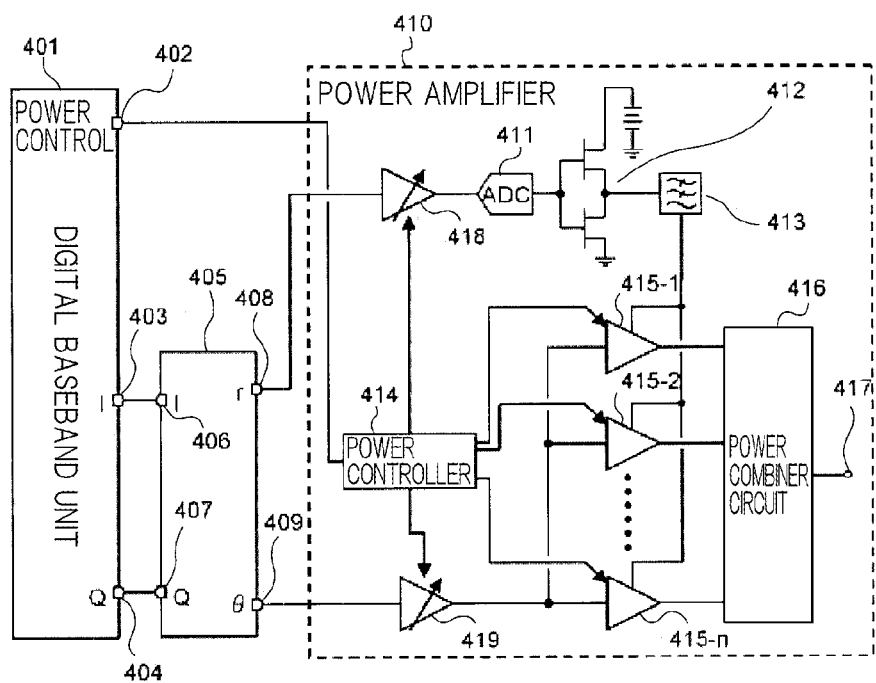
FIG. 7
A diagram showing the configuration of a radio wave transmitter which comprises a power amplifier according to a third embodiment of the present invention.

FIG. 7 shows the configuration of a radio wave transmitter which comprises power amplifier 410 according to the third embodiment of the present invention.

The radio wave transmitter shown in FIG. 7 comprises digital baseband unit 401, polar coordinate conversion circuit 405, and power amplifier 410, as is the case with the second embodiment.

Digital baseband unit 401 in turn comprises power control signal output terminal 402, I-signal output terminal 403, and Q-signal output terminal 404. Polar coordinate conversion circuit 405 in turn comprises I-signal input terminal 406, Q-signal input terminal 407, envelope signal output terminal 408, and phase modulated signal output terminal 409. Power amplifier 410 in turn comprises variable gain amplifier 418, AD converter 411, switching amplifier 412, low-pass filter 413, power controller 414, high-frequency variable gain amplifier 419, high-frequency power amplifiers 415-1~415-n (n is an integer given by n≧2), power combiner circuit 416, and modulated signal output terminal 417.

Digital baseband unit 401 generates a power control signal, an I-signal, and a Q-signal. The power control signal is delivered from power control signal output terminal 402 to power amplifier 401. The I-signal and Q-signal are delivered to polar coordinate conversion circuit 405 from I-signal output terminal 403 and Q-signal output terminal 404, respectively.

Polar coordinate conversion circuit 405 is applied with the I-signal and Q-signal from I-signal input terminal 406 and Q-signal input terminal 407, respectively. Polar coordinate conversion circuit 405 generates a high-frequency modulated signal based on the I/Q signals applied thereto. Further, polar coordinate conversion circuit 405 generates an envelope signal which includes only an amplitude modulated component of the high-frequency modulated signal, and also generates a phase modulated signal as a carrier signal. The phase modulated signal includes only a phase modulated component of the high-frequency modulated signal, is up-converted to a carrier frequency band, and presents a substantially constant envelope. The envelope signal and phase modulated signal are respectively delivered from envelope signal output terminal 408 and phase modulated signal output terminal 409 to power amplifier 410.

In power amplifier 410, the envelope signal delivered from envelope signal output terminal 408 is applied to variable gain amplifier 418. The power control signal delivered from power control signal output terminal 402 in turn is applied to power controller 414. The phase modulated signal delivered from phase modulated signal output terminal 409 in turn is delivered to high-frequency variable gain amplifier 419.

Variable gain amplifier 418 is positioned antecedent to AD converter 411. Variable gain amplifier 418, whose gain is controlled by power controller 414, delivers a power-adjusted envelope signal to AD converter 411.

High-frequency variable gain amplifier 419 is positioned antecedent to high-frequency power amplifiers 415-1~415-n. Likewise, high-frequency variable gain amplifier 419, whose gain is controlled by power controller 414, delivers a power-adjusted phase modulated signal to high-frequency power amplifiers 415-1~415-n.

AD converter 411 converts the envelope signal delivered from variable gain amplifier 418 to a time discrete signal which is delivered to switching amplifier 412.

Switching amplifier 412 highly efficiently amplifies the time discrete signal applied thereto, and delivers the amplified time discrete signal to power supply terminals of high-frequency power amplifiers 415-1~415-n through low-pass filter 413 to remove high-frequency noise.

Power controller 414 individually generates control signals delivered to variable gain amplifier 418, high-frequency variable gain amplifier 419, and the plurality of high-frequency power amplifiers 415-1~415-n based on the power control signal delivered from power control signal output terminal 402.

The control signal delivered from power controller 414 determines that each of high-frequency power amplifiers 415-1~415-n is to enter an on-state or an off-state. High-frequency power amplifier 415-1~415-n, when in the on-state, amplifies the phase modulated signal delivered from high-frequency variable gain amplifier 419 by multiplying the same by the envelope signal delivered from low-pass filter 413 for use as a power supply, to generate a modulated signal. On the other hand, high-frequency power amplifier 415-1~415-n, when in the off-state, does not generate the modulated signal, but remains in a sleep state. Output signals of high-frequency power amplifiers 415-1~415-n are combined by power combiner circuit 416, and delivered from modulated signal output terminal 417.

Power amplifier 410 of this embodiment comprises variable gain amplifier 418 and high-frequency gain amplifier 419 added to the configuration of the second embodiment and is modified such that the average power of the output signal can be adjusted by a method other than the on/off control of high-frequency power amplifiers 415-1~415-n. With this modification, the average power of the output signal can be adjusted with sufficient accuracy, while the linearity is not largely damaged, even if a reduced number of high-frequency power amplifiers 415-1~415-n are turned on.

Figure 8:
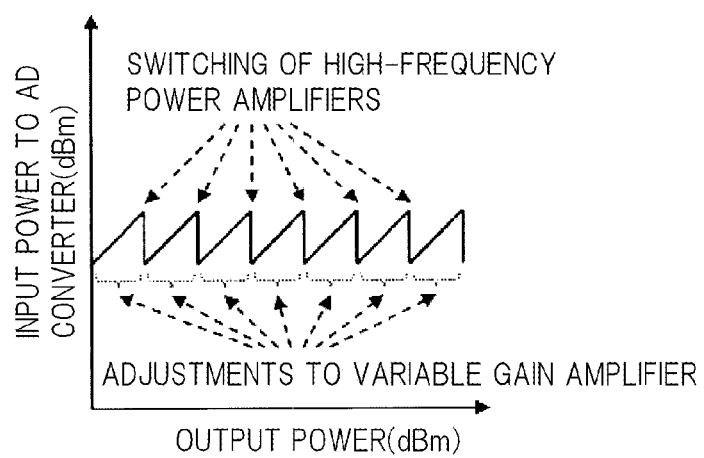
FIG. 8
A diagram for describing a method of controlling output power in power amplifiers according to a third and a fifth embodiment of the present invention.

FIG. 8 shows the relationship between the input power of AD converter 411 and the output power at modulated signal output terminal 417 in power amplifier 410 of this embodiment.

Figure 3:
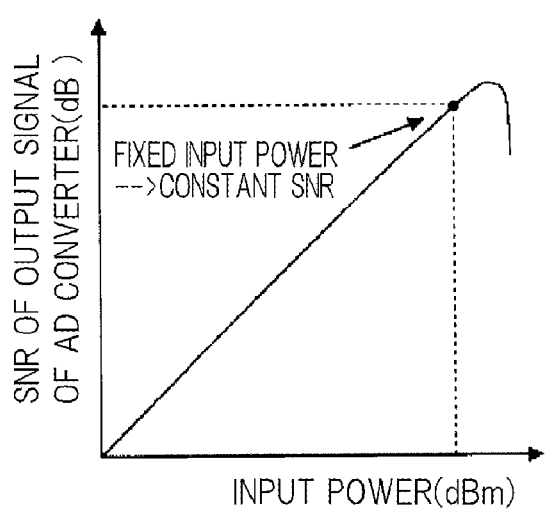
FIG. 3
A diagram for describing the SNR characteristic of an AD converter.
Figure 9:
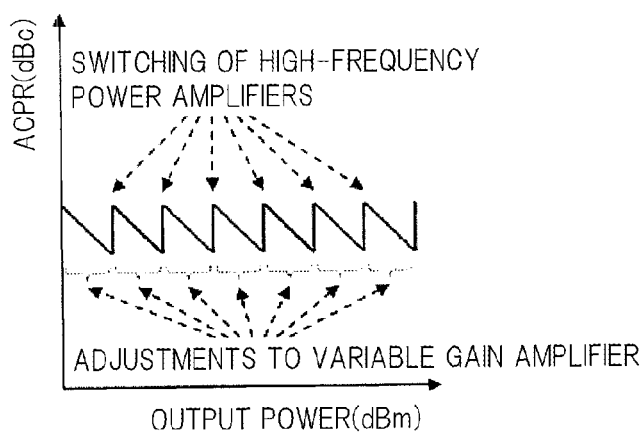
FIG. 9
A diagram for describing the relationship between the output power and linearity in the power amplifiers according to the third and fifth embodiments of the present invention.

As shown in FIG. 8, in power amplifier 410 of this embodiment, high-frequency power amplifiers 415-1~415-n are turned on/off when the output power is largely changed, and fine adjustments of the output power are made by varying the gain of variable gain amplifier 418. By conducting the power control as shown in FIG. 8, variations in input power of AD converter 411 can be limited to a smaller range, as compared with variations in output power of modulated signal output terminal 417. AD converter 411 provides an output signal with a higher SNR since the input power is larger (see FIG. 3). Accordingly, the linearity (ACPR) of the modulated signal delivered from modulated signal output terminal 417 behaves as shown in FIG. 9 in accordance with the magnitude of the output power.

Notably, in power amplifier 410 of this embodiment, a method of designing/controlling high-frequency power amplifiers 415-1~415-n can be modified in accordance with a desired output power.

For example, when all high-frequency power amplifiers 415-1~415-n are designed such that their saturated output powers are equal to one another, a proportional relationship is developed between the number of high-frequency power amplifiers 415-1~415-n in the on-state and the output power, thus making it easier to control the output power. In this event, power controller 414 converts the power control signal delivered from power control signal output terminal 402 to a value at one of (n+1) steps from zero to n, and controls high-frequency power amplifiers 415-1~415-n such that the converted value at one of (n+1) steps is equal to the number of high-frequency power amplifiers 415-1~415-n which are turned on.

As another example, it is also contemplated to design high-frequency power amplifiers 415-1~415-n such that their saturated output powers are respectively provided in the ratio of, such as $1:2:4: \ldots :2(n-1)$. In doing so, the output power can be controlled in a range of zero to $2(n-1)$ times as large as a minimum step width of the output power. Here, the minimum step width of the output power is equal to the saturated power of high-frequency power amplifier 415-1. In this event, power controller 414 converts the power control signal delivered from power control signal output terminal 402 to an n-bit signal, and controls high-frequency power amplifiers 415-1~415-n such that high-frequency power amplifier 415-k is brought into on-state when a k-th bit ($1 \leq k \leq n$) counted from the least significant bit is "1" (High), and is brought into off-state when it is zero (Low).

High-frequency variable gain amplifier 419 serves to allow high-frequency power amplifiers 415-1~415-n to operate in an optimally saturated state. High-frequency power amplifiers 415-1~415-n alternatively enter a saturated state or a sleep state, where the linearity and efficiency vary in response to variations in average voltage of the power supply provided from low-pass filter 413. Such variations in linearity and efficiency can be corrected for by adjusting the average input power of high-frequency power amplifiers 415-1~415-n by high-frequency variable gain amplifier 419. However, no problem will arise as long as sufficient power is ensured to saturate high-frequency power amplifiers 415-1~415-n. Accordingly, high-frequency variable gain amplifier 419 is not an essential component for this embodiment, and can be omitted if phase modulated signal output terminal 409 is directly coupled to high-frequency power amplifiers 415-1~415-n.

Alternatively, in power amplifier 410 of this embodiment, the phase modulated signal delivered from phase modulated signal output terminal 409 may be replaced with a modulated signal which includes a phase modulated component and an amplitude modulated component of a high-frequency modulated signal. In this configuration, power amplifier 410 performs an operation referred to as "envelope tracking," and behaves as an envelope tracking type power amplifier.

Fourth Embodiment

Figure 10:
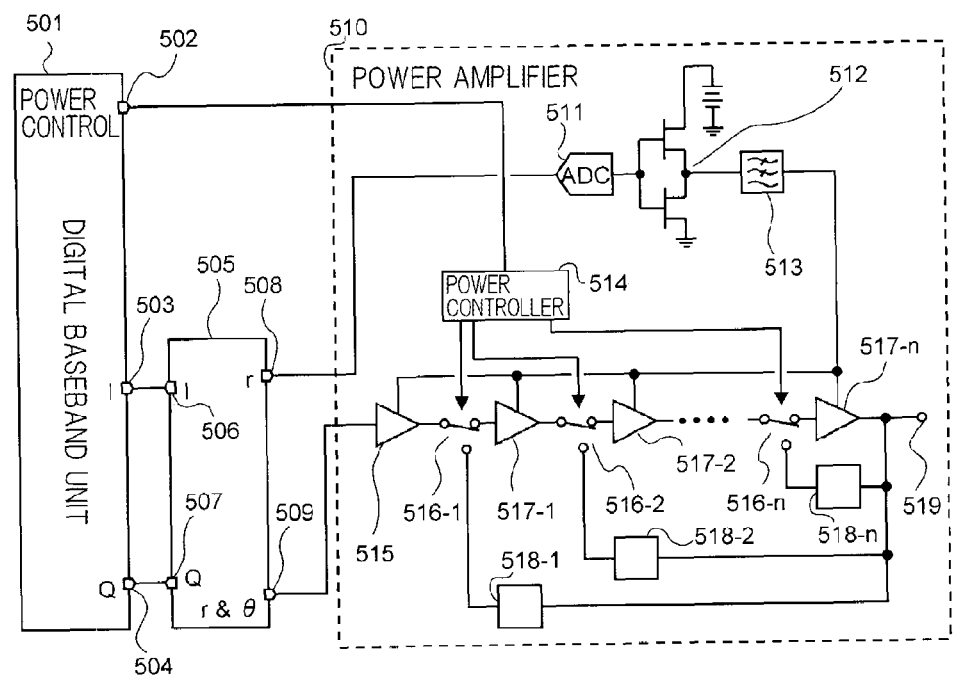
FIG. 10
A diagram showing the configuration of a radio wave transmitter which comprises a power amplifier according to a fourth embodiment of the present invention.

FIG. 10 shows the configuration of a radio wave transmitter which comprises power amplifier 510 according to a fourth embodiment of the present invention.

The radio wave transmitter shown in FIG. 10 comprises digital baseband unit 501, polar coordinate conversion circuit 505, and power amplifier 510, as is the case with the second and third embodiments.

Digital baseband unit 501 in turn comprises power control signal output terminal 502, I-signal output terminal 503, and Q-signal output terminal 504. Polar coordinate conversion circuit 505 in turn comprises I-signal input terminal 506, Q-signal input terminal 507, envelope signal output terminal 508, and phase modulated signal output terminal 509. Power amplifier 510 in turn comprises AD converter 511, switching amplifier 512, low-pass filter 513, power controller 514, high-frequency power pre-amplifier 515, high-frequency switches 516-1~516-n (integer given by n≧1), high-frequency power amplifiers 517-1~517-n (integer given by n≧2), matching circuits 518-1~518-n (integer given by n≧1), and modulated signal output terminal 519. Notably, in this embodiment, power amplifier 510 comprises a plurality (n+1) of high-frequency power amplifiers, where a high-frequency power amplifier at the first stage is particularly designated by high-frequency power pre-amplifier 515, and the remaining ones are designated by high-frequency power amplifiers 517-1~517-n.

Digital baseband unit 501 generates a power control signal, an I-signal, and a Q-signal. The power control signal is delivered from power control signal output terminal 502 to power amplifier 510. The I-signal and Q-signal are delivered to polar coordinate conversion circuit 505 from I-signal output terminal 503 and Q-signal output terminal 504, respectively.

Polar coordinate conversion circuit 505 is applied with the I-signal and Q-signal from I-signal input terminal 506 and Q-signal input terminal 507, respectively. Polar coordinate conversion circuit 505 generates a high-frequency modulated signal based on the I/Q signals applied thereto. Further, polar coordinate conversion circuit 505 generates an envelope signal which includes only an amplitude modulated component of the high-frequency modulated signal, and also generates a phase modulated signal as a carrier signal. The phase modulated signal includes only a phase modulated component of the high-frequency modulated signal, is up-converted to a carrier frequency band, and presents a substantially constant envelope. The envelope signal and phase modulated signal are respectively delivered from envelope signal output terminal 508 and phase modulated signal output terminal 509 to power amplifier 510.

In power amplifier 510, the envelope signal delivered from envelope signal output terminal 508 is applied to AD converter 511. The power control signal delivered from power control signal output terminal 502 in turn is applied to power controller 514. The phase modulated signal delivered from phase modulated signal output terminal 509 in turn is delivered to high-frequency power pre-amplifier 515. The envelope signal applied to AD converter 511 has substantially constant average power at all times. This is because the output power of power amplifier 510 is not controlled antecedent to AD converter 511, but is controlled by way of a path different from the envelope signal amplification path. For a similar reason, the signal applied to high-frequency power pre-amplifiers 515 also has a substantially constant average power at all times.

AD converter 511 converts the envelope signal delivered from envelope signal output terminal 508 to a time discrete signal which is delivered to switching amplifier 512.

Switching amplifier 512 highly efficiently amplifies the time discrete signal applied thereto, and delivers the amplified time discrete signal to power supplies of high-frequency power pre-amplifier 515 and high-frequency power amplifiers 517-1~517-n through low-pass filter 513 for removing high-frequency noise.

Power controller 514 individually generates control signals delivered to high-frequency switches 516-1~516-n based on the power control signal delivered from power control signal output terminal 502.

High-frequency power pre-amplifier 515 amplifies the phase modulated signal delivered from phase modulated signal output terminal 509 by multiplying the same by the envelope signal delivered from low-pass filter 513 for use as a power supply, and delivers its output signal to following high-frequency switch 516-1.

High-frequency switches 516-1~516-n are one-input, two-output switches which are respectively connected antecedent to high-frequency power amplifiers 517-1~517-n. High-frequency switch 516-1 has an input terminal connected to high-frequency power pre-amplifier 515, and a first output terminal connected to following high-frequency power amplifier 517-1. High-frequency switch 516-$k$ ($2 \leq k \leq n$) has an input terminal connected to preceding high-frequency power amplifier 517-$o$ ($o=k-1$), and a first output terminal connected to following high-frequency power amplifier 517-$k$. Additionally, high-frequency switches 516-$k$ ($1 \leq k \leq n$) have their respective second output terminals connected to matching circuit 518-$k$.

High-frequency power amplifier 517-$k$ ($1 \leq k \leq n-1$) amplifies the output signal of preceding high-frequency switch 516-$k$, and delivers its output signal to following high-frequency switch 516-$m$ ($m=k+1$). High-frequency power amplifier 517-$n$ amplifies the output signal of preceding high-frequency switch 516-$n$, and delivers its output signal to modulated signal output terminal 519.

High-frequency switch 516-$k$ ($1 \leq k \leq n-1$) determines, in accordance with a control signal delivered from power controller 514, whether a phase modulated signal delivered from high-frequency power pre-amplifier 515 should be amplified by high-frequency power amplifier 517-$k$ and sent to following high-frequency switch 516-$m$ ($m=k+1$) or whether the phase modulated signal should be delivered from modulated signal output terminal 519 through matching circuit 518-$k$. When high-frequency switches 516-$k$ are all connected to high-frequency power amplifiers 517-$k$, the phase modulated signal delivered from phase modulated signal output terminal 509 travels up to high-frequency switch 516-$n$. In this event, high-frequency switch 516-$n$ determines, in accordance with a control signal delivered from power controller 514, whether a phase modulated signal applied thereto should be amplified by high-frequency power amplifier 517-$n$ and delivered from following modulated signal output terminal 519 or whether the phase modulated signal should be delivered from modulated signal output terminal 519 through matching circuit 518-$n$.

In power amplifier 510 of this embodiment, high-frequency power amplifiers 517-1~517-$n$ are designed such that their saturated output powers increase at later stages.

For example, when high-frequency power amplifiers 517-1~517-$n$ are designed such that their saturated output powers are provided in a ratio of, such as $1:A:A^2 \ldots :A^{(n-1)}$, step widths of output power are substantially constant on a decibel scale, thus facilitating the power control. Here, A is an arbitrary positive real number. In this event, power controller 514 converts a power control signal delivered from power control signal output terminal 502 to a logarithmic value which is further converted to a value at one of (n+1) steps from zero to n. When the value resulting from the conversion to the (n+1) steps is j−1 ($1 \leq j \leq n$), power controller 514 controls high-frequency switches 516-1~516-$n$ such that the phase modulated signal is delivered from modulated signal output terminal 519 through matching circuit 518-$j$.

Since the gain of overall power amplifier 510 is determined by to which stages high-frequency power amplifiers 517-1~517-$n$ are used, the average power of the output signal can be adjusted by selecting high-frequency switches 516-1~516-$n$. Also, like the second embodiment, since the average power of the envelope signal applied to AD converter 511 is a substantially constant at all times, the modulated signal delivered from modulated signal output terminal 519 presents a substantially constant SNR at all times.

Alternatively, in power amplifier 510 of this embodiment, the phase modulated signal delivered from phase modulated signal output terminal 509 may be replaced with a modulated signal which includes a phase modulated component and an amplitude modulated component of a high-frequency modulated signal. In this event, high-frequency power pre-amplifier 515 can be removed such that phase modulated output terminal 509 is directly coupled to high-frequency switch 516-1. In this configuration, power amplifier 510 performs an operation referred to as "envelope tracking," and behaves as an envelope tracking type power amplifier.

Fifth Embodiment

A power amplifier according to a fifth embodiment of the present invention is modified such that the average power of the output signal can be adjusted by a method other than the switching control of high-frequency switches 516-1~516-$n$, as performed in the fourth embodiment.

Figure 11:
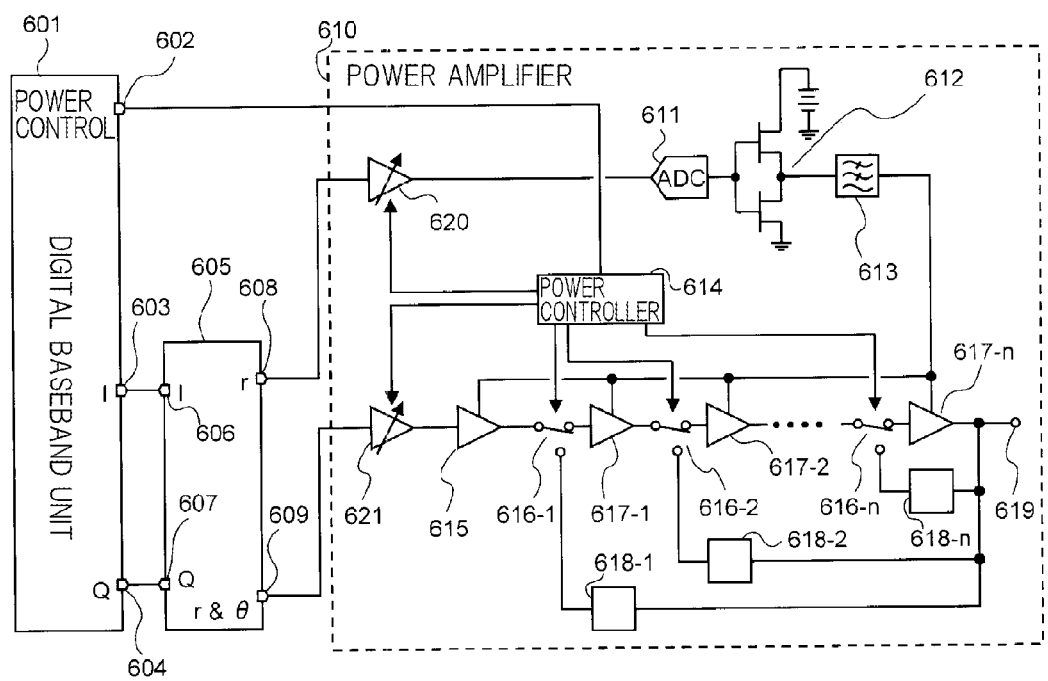
FIG. 11
A diagram showing the configuration of a radio wave transmitter which comprises the power amplifier according to the fifth embodiment of the present invention.

FIG. 11 shows the configuration of a radio wave transmitter which comprises power amplifier 610 according to the fifth embodiment of the present invention.

The radio wave transmitter shown in FIG. 11 comprises digital baseband unit 601, polar coordinate conversion circuit 605, and power amplifier 610, as is the case with the second through fourth embodiments.

Digital baseband unit 601 in turn comprises power control signal output terminal 602, I-signal output terminal 603, and Q-signal output terminal 604. Polar coordinate conversion circuit 605 in turn comprises I-signal input terminal 606, Q-signal input terminal 607, envelope signal output terminal 608, and phase modulated signal output terminal 609. Power amplifier 610 comprises variable gain amplifier 620, AD converter 611, switching amplifier 612, low-pass filter 613, power controller 614, high-frequency variable gain amplifier 621, high-frequency power pre-amplifier 615, high-frequency switches 616-1~616-$n$ (integer given by $n \geq 1$), high frequency power amplifiers 617-1~617-$n$ (integer $n \geq 1$), matching circuits 618-1~618-$n$ (integer given by $n \geq 1$), and modulated signal output terminal 619. Notably, in this embodiment, power amplifier 610 comprises a plurality (n+1) of high-frequency power amplifiers, where a high-frequency power amplifier at the first stage is particularly designated by high-frequency power pre-amplifier 615, and the remaining ones are designated by high-frequency power amplifiers 617-1~617-$n$.

Digital baseband unit 601 generates a power control signal, an I-signal, and a Q-signal. The power control signal is delivered from power control signal output terminal 602 to power amplifier 610. The I-signal and Q-signal are delivered to polar coordinate conversion circuit 605 from I-signal output terminal 603 and Q-signal output terminal 604, respectively.

Polar coordinate conversion circuit 605 is applied with the I-signal and Q-signal from I-signal input terminal 606 and Q-signal input terminal 607, respectively. Polar coordinate conversion circuit 605 generates a high-frequency modulated signal based on the I/Q signals applied thereto. Further, polar coordinate conversion circuit 605 generates an envelope signal which includes only an amplitude modulated component of the high-frequency modulated signal, and also generates a phase modulated signal as a carrier signal. The phase modulated signal includes only a phase modulated component of the high-frequency modulated signal, is up-converted to a carrier frequency band, and presents a substantially constant envelope. The envelope signal and phase modulated signal are respectively delivered from envelope signal output terminal 608 and phase modulated signal output terminal 609 to power amplifier 610.

In power amplifier 610, the envelope signal delivered from envelope signal output terminal 608 is applied to variable gain amplifier 620. The power control signal delivered from power control signal output terminal 602 in turn is applied to power controller 614. The phase modulated signal delivered from phase modulated signal output terminal 609 in turn is delivered to high-frequency variable gain amplifier 621.

Variable gain amplifier 620 is positioned antecedent to AD converter 611. Variable gain amplifier 620, whose gain is controlled by power controller 614, delivers a power-adjusted envelope signal to AD converter 611.

High-frequency variable gain amplifier 621 is positioned antecedent to high-frequency power pre-amplifier 615. Likewise, high-frequency variable gain amplifier 621, whose gain is controlled by power controller 614, delivers a power-adjusted modulated signal to high-frequency power pre-amplifier 615.

AD converter 611 converts the envelope signal delivered from variable gain amplifier 620 to a time discrete signal which is delivered to switching amplifier 612.

Switching amplifier 612 highly efficiently amplifies the time discrete signal applied thereto, and delivers the amplified time discrete signal to the power supply terminals of high-frequency power pre-amplifier 615 and high-frequency power amplifiers 617-1~617-$n$ through low-pass filter 613 to remove high-frequency noise.

Power controller 614 individually generates control signals delivered to a plurality of variable gain amplifiers 620, high-frequency variable gain amplifier 621, and high-frequency power amplifiers 616-1~616-$n$ based on the power control signal delivered from power control signal output terminal 602.

High-frequency power pre-amplifier 615 amplifies the phase modulated signal delivered from high-frequency variable gain amplifier 621 by multiplying the same by the envelope signal delivered from low-pass filter 613 for use as a power supply, and delivers the output signal to following high-frequency switch 616-1.

High-frequency switches 616-1~616-$n$ are one-input, two-output switches which are respectively connected antecedent to high-frequency power amplifiers 617-1~617-$n$. High-frequency switch 616-1 has an input terminal connected to high-frequency power pre-amplifier 615, and a first output terminal connected to following high-frequency power amplifier 617-1. High-frequency switch 616-$k$ ($2 \leq k \leq n$) has an input terminal connected to preceding high-frequency power amplifier 617-$o$ ($o=k-1$), and a first output terminal connected to following high-frequency power amplifier 517-$k$. Additionally, high-frequency switches 616-$k$ ($1 \leq k \leq n$) have their respective second output terminals connected to matching circuit 618-$k$.

High-frequency power amplifier 617-$k$ ($1 \leq k \leq n-1$) amplifies the output signal of preceding high-frequency switch 616-$k$, and delivers its output signal to following high-frequency switch 616-$m$ (m=k+1). High-frequency power amplifier 617-$n$ amplifies the output signal of previous high-frequency switch 616-$n$, and delivers its output signal to modulated signal output terminal 619.

High-frequency switch 616-$k$ ($1 \leq k \leq n-1$) determines, in accordance with a control signal delivered from power controller 614, whether a phase modulated signal delivered from high-frequency power pre-amplifier 615 should be amplified by high-frequency power amplifier 617-$k$ and sent to following high-frequency switch 616-$m$ (m=k+1) or whether it should be delivered from modulated signal output terminal 619 through matching circuit 618-k. When high-frequency switches 616-k are all connected to high-frequency power amplifiers 617-k, the phase modulated signal delivered from phase modulated signal output terminal 609 travels up to high-frequency switch 616-n. In this event, high-frequency switch 616-n determines, in accordance with a control signal delivered from power controller 614, whether a phase modulated signal applied thereto should be amplified by high-frequency power amplifier 617-n and delivered from following modulated signal output terminal 619 or whether the phase modulated signal should be delivered from modulated signal output terminal 619 through matching circuit 618-n.

In power amplifier 610 of this embodiment, high-frequency power amplifiers 617-1~617-n are designed such that their saturated output powers increase at later stages.

For example, when high-frequency power amplifiers 617-1~617-n are designed such that their saturated output powers are provided in a ratio of, such as $1:A:A^2 \ldots :A^{(n-1)}$, step widths of output power are substantially constant on a decibel scale, thus facilitating power control. Here, A is an arbitrary positive real number. In this event, power controller 614 converts a power control signal delivered from power control signal output terminal 602 to a logarithmic value which is further converted to a value at one of (n+1) steps from zero to n. When the value resulting from the conversion to the (n+1) steps is j−1 ($1 \leq j \leq n$), power controller 614 controls high-frequency switches 616-1~616-n such that the phase modulated signal is delivered from modulated signal output terminal 619 through matching circuit 618-j.

Since the gain of overall power amplifier 610 is determined by to which stages high-frequency power amplifiers 617-1~617-n are used, the average power of the output signal can be adjusted by selecting high-frequency switches 616-1~616-n. Also, when the gain control is additionally conducted using variable gain amplifier 620 as is the case with the third embodiment, the relationship between the output power and the linearity can be established as shown in FIG. 9.

High-frequency variable gain amplifier 621 is provided for operating high-frequency power pre-amplifier 615 and high-frequency power amplifiers 617-1~617-n in an optimally saturated state. The linearity and efficiency of high-frequency power pre-amplifier 615 and high-frequency power amplifiers 617-1~617-n vary in response to variations in the average voltage of the power supply provided from low-pass filter 613. Such variations in linearity and efficiency can be corrected for by adjusting the average input power of high-frequency power amplifiers 617-1~617-n by high-frequency variable gain amplifier 621. However, no problem will arise in regard to operations as long as sufficient power is ensured to saturate high-frequency power pre-amplifier 615. Accordingly, high-frequency variable gain amplifier 621 is not an essential component for this embodiment, and can be omitted if phase modulated signal output terminal 609 is directly coupled to high-frequency power pre-amplifier 615.

Alternatively, in power amplifier 610 of this embodiment, the phase modulated signal delivered from phase modulated signal output terminal 609 may be replaced with a modulated signal which includes a phase modulated component and an amplitude modulated component of a high-frequency modulated signal. In this event, high-frequency power pre-amplifier 615 can be removed such that phase modulated output terminal 609 is directly coupled to high-frequency switch 616-1. In this configuration, power amplifier 610 performs an operation referred to as "envelope tracking," and behaves as an envelope tracking type power amplifier.

While the present invention has been described above with reference to some embodiments, the present invention is not limited to the foregoing embodiments. The present invention can be modified in configuration and details in various manners which can be understood by those skilled in the art to be within the scope of the present invention.

This application claims the priority based on Japanese Patent Application No. 2007-287282 filed Nov. 5, 2007, the disclosure of which is incorporated herein by reference in its entirety.

The invention claimed is:

1. A power amplifier for amplifying a high-frequency modulated signal, comprising:
   a first processing unit for amplifying an envelope signal included in the high-frequency modulated signal, said envelope signal including only an amplitude modulated component of the high-frequency modulated signal; and
   a second processing unit for adjusting an average power of an output signal of said power amplifier,
   wherein said first processing unit includes:
   an AD converter for converting the envelope signal to a time discrete signal;
   a switching amplifier for amplifying an output signal of said AD converter;
   a low-pass filter for removing high-frequency noise from an output signal of said switching amplifier; and
   a power combiner circuit, and
   said second processing unit includes:
   a plurality of high-frequency power amplifiers supplied with an output signal of said low-pass filter as a power supply for amplifying a carrier signal included in the high-frequency modulated signal, said plurality of high-frequency power amplifiers being arranged in parallel, each of said plurality of high-frequency power amplifiers being configured to amplify the carrier signal by multiplying the carrier signal by the power supply, and the power combiner circuit is configured for combining output signals of said plurality of high-frequency power amplifiers and for delivering the combined output signal to the outside; and
   a power controller for controlling a total gain of said plurality of high-frequency power amplifiers based on a power control signal independent of the high-frequency modulated signal to adjust an average power of an output signal of said power amplifier, said power controller being configured to conduct on/off control for said plurality of high-frequency power amplifiers to adjust an average power of the output signal of said power amplifier.

2. The power amplifier according to claim 1, further comprising:
   a variable gain amplifier positioned antecedent to said AD converter,
   wherein said power controller controls the gain of said variable gain amplifier.

3. The power amplifier according to claim 2, wherein said envelope signal applied to said AD converter has a substantially constant average power.

4. The power amplifier according to claim 2, wherein said carrier signal is a signal which includes only a phase modulated component of the high-frequency modulated signal.

5. The power amplifier according to claim 1, further comprising:
   a high-frequency variable gain amplifier positioned antecedent to said plurality of high-frequency power amplifiers,
   wherein said power controller controls the gain of said high-frequency variable gain amplifier.

6. The power amplifier according to claim 5, wherein said envelope signal applied to said AD converter has a substantially constant average power.

7. The power amplifier according to claim 5, wherein said carrier signal is a signal which includes only a phase modulated component of the high-frequency modulated signal.

8. The power amplifier according to claim 1, wherein said envelope signal applied to said AD converter has a substantially constant average power.

9. The power amplifier according to claim 8, wherein said carrier signal is a signal which includes only a phase modulated component of the high-frequency modulated signal.

10. The power amplifier according to claim 1, wherein said carrier signal is a signal which includes only a phase modulated component of the high-frequency modulated signal.

11. The power amplifier according to claim 1, wherein said carrier signal is a signal which includes a phase modulated component and an amplitude modulated component of the high-frequency modulated signal.

12. A radio wave transmitter comprising a power amplifier according to claim 1, further comprising:
- a digital baseband circuit for generating the power control signal, an I-signal, and a Q-signal; and
- a polar coordinate conversion circuit for generating the envelope signal and the carrier signal based on the I-signal and the Q-signal delivered from said digital baseband circuit,
- wherein said AD converter receives the envelope signal delivered from said polar coordinate conversion circuit,
- said plurality of high-frequency power amplifiers receive the carrier signal delivered from said polar coordinate conversion circuit, and
- said power controller receives the power control signal delivered from said digital baseband circuit, and conducts on/off control for said plurality of high-frequency power amplifiers based on the power control signal to adjust the average power of the output signal of said power amplifier.

13. A power amplifier for amplifying a high-frequency modulated signal, comprising:
- a first processing unit for amplifying an envelope signal included in the high-frequency modulated signal, said envelope signal including only an amplitude modulated component of the high-frequency modulated signal; and
- a second processing unit for adjusting an average power of an output signal of said power amplifier,
- wherein said first processing unit includes:
- an AD converter for converting the envelope signal to a time discrete signal;
- a switching amplifier for amplifying an output signal of said AD converter; and
- a low-pass filter for removing high-frequency noise from an output signal of said switching amplifier, and
- said second processing unit includes:
- a plurality of high-frequency power amplifiers supplied with an output signal of said low-pass filter as a power supply for amplifying a carrier signal included in the high-frequency modulated signal; and
- a power controller for controlling a total gain of said plurality of high-frequency power amplifiers based on a power control signal independent of the high-frequency modulated signal to adjust an average power of an output signal of said power amplifier,
- wherein
- said plurality of high-frequency power amplifiers are arranged in series,
- said power amplifier further comprises:
- high-frequency switches each having one input terminal and two output terminals, disposed between respective ones of said plurality of high-frequency power amplifiers, each said high-frequency switch having the input terminal connected to said high-frequency power amplifier preceding thereto, and a first output terminal connected to said high-frequency power amplifier subsequent thereto; and
- a matching circuit connected to second output terminals of said high-frequency switches for delivering an output signal to the outside,
- said high-frequency power amplifier at the first stage multiplies the carrier signal by the power supply for amplification, and delivers the output signal to said high-frequency switch subsequent thereto,
- said high-frequency power amplifiers except for those at the first stage and the final stage amplify an output signal of said high-frequency switch antecedent thereto, and deliver an output signal to said high-frequency switch subsequent thereto,
- said high-frequency power amplifier at the final stage amplifies an output signal of said high-frequency switch antecedent thereto and delivers the output signal to the outside, and
- said power controller conducts switching control for said high-frequency switches to adjust the average power of the output signal of said power amplifier.

14. The power amplifier according to claim 13, further comprising a variable gain amplifier positioned antecedent to said AD converter,
- wherein said power controller controls the gain of said variable gain amplifier.

15. The power amplifier according to claim 13, further comprising a high-frequency variable gain amplifier positioned antecedent to said plurality of high-frequency power amplifiers,
- wherein said power controller controls the gain of said high-frequency variable gain amplifier.

16. The power amplifier according to claim 13, wherein said envelope signal applied to said AD converter has a substantially constant average power.

17. The power amplifier according to claim 13, wherein said carrier signal is a signal which includes only a phase modulated component of the high-frequency modulated signal.

18. The power amplifier according to claim 13, wherein said carrier signal is a signal which includes a phase modulated component and an amplitude modulated component of the high-frequency modulated signal.

19. A radio wave transmitter comprising the power amplifier according to claim 13, further comprising:
- a digital baseband circuit for generating the power control signal, an I-signal, and a Q-signal; and
- a polar coordinate conversion circuit for generating the envelope signal and the carrier signal based on the I-signal and the Q-signal delivered from said digital baseband circuit,
- wherein said AD converter receives the envelope signal delivered from said polar coordinate conversion circuit,
- a high-frequency power amplifier at a first stage among said plurality of high-frequency power amplifiers receives the carrier signal delivered from said polar coordinate conversion circuit, and
- said power controller receives the power control signal delivered from said digital baseband circuit, and conducts switching control for said high frequency switches based on the power control signal to adjust the average power of the output signal of said power amplifier.

* * * * *